United States Patent
Lei et al.

(10) Patent No.: US 12,149,231 B2
(45) Date of Patent: Nov. 19, 2024

(54) SWITCH CIRCUIT AND ELECTRIC DEVICE

(71) Applicant: SHENZHEN CARKU TECHNOLOGY CO., LIMITED, Guangdong (CN)

(72) Inventors: Yun Lei, Guangdong (CN); Zhifeng Zhang, Guangdong (CN); Jianping Lin, Guangdong (CN)

(73) Assignee: SHENZHEN CARKU TECHNOLOGY CO., LIMITED, Shenzhen (CN)

( * ) Notice: Subject to any disclaimer, the term of this patent is extended or adjusted under 35 U.S.C. 154(b) by 34 days.

(21) Appl. No.: 18/089,657

(22) Filed: Dec. 28, 2022

(65) Prior Publication Data
US 2023/0163756 A1    May 25, 2023

Related U.S. Application Data

(63) Continuation of application No. PCT/CN2020/103037, filed on Jul. 20, 2020.

(51) Int. Cl.
*H03K 17/04*    (2006.01)
*H03K 17/567*    (2006.01)

(52) U.S. Cl.
CPC ........... *H03K 17/04* (2013.01); *H03K 17/567* (2013.01); *H03K 2217/0081* (2013.01)

(58) Field of Classification Search
CPC .............................. H03K 17/04; H03K 17/567
See application file for complete search history.

(56) References Cited

U.S. PATENT DOCUMENTS

2003/0197543 A1* 10/2003 Imai ................. H03K 17/04123
327/427

FOREIGN PATENT DOCUMENTS

| CN | 101325364 A | 12/2008 |
|---|---|---|
| CN | 203911883 U | 10/2014 |
| CN | 107797599 A | 3/2018 |
| CN | 108110734 A | 6/2018 |
| CN | 208174653 U | 11/2018 |
| CN | 111342650 A | 6/2020 |
| JP | 2017028406 A | 2/2017 |

OTHER PUBLICATIONS

The extended European search report issued in corresponding EP application No. 20943575.9 dated Nov. 6, 2023.
WIPO, International Search Report and Written Opinion for International Application No. PCT/CN2020/103037, Mar. 26, 2021.

* cited by examiner

*Primary Examiner* — Metasebia T Retebo
(74) *Attorney, Agent, or Firm* — HAUPTMAN HAM, LLP

(57) ABSTRACT

A switch circuit includes a control unit, a driving unit, a voltage sudden-change unit, and a connection unit. The connection unit is configured to turn on or turn off an electrical connection between a power-supply device and a load. The control unit is configured to control the driving unit to output or stop outputting a driving signal to the connection unit, where the driving signal allows to turn on the connection unit. The voltage sudden-change unit is coupled with a driving node between the driving unit and the connection unit. The control unit is configured to control the voltage sudden-change unit to output a voltage sudden-change signal to the driving node, where the voltage sudden-change signal allows to make the connection unit be switched to a turned-off state from a turned-on state quickly when the driving unit stops outputting the driving signal.

18 Claims, 2 Drawing Sheets

SWITCH CIRCUIT AND ELECTRIC DEVICE

CROSS-REFERENCE TO RELATED APPLICATION(S)

This application is a continuation of International Application No. PCT/CN2020/103037, filed on Jul. 20, 2020, which claims priority to Chinese Patent Application No. 202021236176.4, filed on Jun. 29, 2020, and claims priority to Chinese Patent Application No. 202010605084.7, filed on Jun. 29, 2020 the disclosures of which are hereby incorporated by reference in their entireties.

TECHNICAL FIELD

This disclosure relates to the field of circuits, and particularly to a switch circuit and an electric device.

BACKGROUND

For a circuit of an electronic device, a switch element is generally provided between a power-supply terminal and a load terminal, and an electrical connection between the power-supply terminal and the load terminal is turned on or turned off by controlling switching of a turned-on state and a turned-off state of the switch element.

The existing switch element generally includes transistors, such as metal oxide semiconductor (MOS) transistors, etc. However, due to instantaneous impact of a current with a load connected, the time for the transistor to be switched between the turned-on state and the turned-off state is relatively long, which causes the transistor to work in a linear region or be burnt out. As a result, reliability of the entire electronic device is reduced.

SUMMARY

Implementations of the disclosure provide a switch circuit. The switch circuit includes a control unit, a driving unit, a voltage sudden-change unit, and a connection unit. The connection unit is electrically coupled between a power-supply device and a load, and is configured to turn on or turn off an electrical connection between the power-supply device and the load. The control unit is electrically coupled with the driving unit, the driving unit is further electrically coupled with the connection unit, and the control unit is configured to output an enable signal to the driving unit to control the driving unit to output or stop outputting a driving signal to the connection unit, where the driving signal allows to turn on the connection unit. The voltage sudden-change unit is electrically coupled with a driving node between the driving unit and the connection unit, the control unit is further electrically coupled with the voltage sudden-change unit, and the control unit is further configured to output the enable signal to the voltage sudden-change unit to control the voltage sudden-change unit to generate and output a voltage sudden-change signal to the driving node, where the voltage sudden-change signal allows to control a potential at the driving node to experience sudden change when the driving unit stops outputting the driving signal, to make the connection unit be switched to a turned-off state from a turned-on state quickly when no driving signal is received.

Implementations of the disclosure provide an electric device. The electric device includes a power-supply device, a load, and the above switch circuit. The power-supply device is electrically coupled with the load via the switch circuit, and the power-supply device is configured to output a power signal to the load when the switch circuit is in the turned-on state. The load is configured to receive the power signal when the switch circuit is in the turned-on state and operate according to the power signal.

BRIEF DESCRIPTION OF THE DRAWINGS

In order to describe technical solutions of implementations of the disclosure more clearly, the following will give a brief description of accompanying drawings used for describing the implementations. Apparently, accompanying drawings described below are merely some implementations. Those of ordinary skill in the art can also obtain other accompanying drawings based on the accompanying drawings described below without creative efforts.

DETAILED DESCRIPTION

Technical solutions of implementations of the disclosure will be described below in a clear and comprehensive manner with reference to accompanying drawings intended for the implementations. It is evident that the implementations described herein constitute merely some rather than all implementations of the disclosure, and that those of ordinary skill in the art will be able to derive other implementations based on these implementations without making creative efforts, which all such derived implementations shall all fall in the protection scope of the disclosure.

Hereinafter, implementations are described with reference to the accompanying drawings to illustrate exemplary implementations of the disclosure. The directional terms of the disclosure such as "up", "down", "front", "rear", "left", "right", "inner", "outer", "side", and the like describe directions illustrated in the accompanying drawings, which are intended to facilitate a better and clear description and understanding of the disclosure, rather than indicating or implying that a certain device or element must have a specific orientation or must be constructed and operated in a specific orientation, and therefore, the directional terms should not be understood as a limitation of the disclosure. In addition, in implementations of the disclosure, it is appreciated that the terms "dispose", "interconnect", "connect", and "fix" should be understood in a broad sense unless otherwise specified and limited. For example, the terms "interconnect" and "connect" may refer to fixedly connect, detachably connect, or integrally connect. The terms "interconnect" and "connect" may also refer to mechanically connect. The terms "interconnect" and "connect" may also refer to directly connect, indirectly connect through an intermediate medium, intercommunicate interiors of two elements. For those of ordinary skill in the art, the specific meanings of the above terms in the implementations of the disclosure can be understood according to specific situations.

In the disclosure, the terms "of", "corresponding", and "relevant" can be interchangeable in some cases. It is appreciated that the meanings of these terms are the same, unless otherwise stated. In addition, in order to facilitate a clear description of the technical solutions of the implementations of the disclosure, in the implementations of the disclosure, the terms such as "first" and "second" are used to distinguish same or similar items with substantially a same function and effect. Those skilled in the art can understand that the terms such as "first" and "second" are not used to limit the number of the items and the order of execution, nor are these terms used to limit the items to be different. In addition, the terms "include", "comprise", and "have" as well as variations thereof are intended to cover non-exclusive inclusion.

Figure 1:
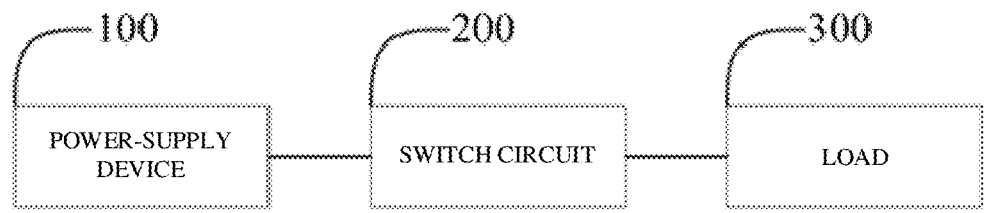
FIG. 1 is a schematic structural diagram illustrating an electric device according to implementations.

FIG. 1 is a schematic structural diagram illustrating an electric device 10 according to implementations. As illustrated in FIG. 1, the electric device 10 includes a power-supply device 100, a switch circuit 200, and a load 300. The power-supply device 100 is electrically coupled with the load 300 via the switch circuit 200, and is configured to transmit a power signal to the load 300 when the switch circuit 200 is in a turned-on state.

In implementations of the disclosure, the power-supply device 100 may include a storage battery. The storage battery may be a nickel-cadmium battery, a lithium polymer battery, or other batteries that can supply a power signal to the load 300, which is not limited in the disclosure.

In implementations of the disclosure, the power-supply device 100 may include a generator powered by combustible energy sources. The combustible energy sources may include natural fuels (e.g., hydrogen, gasoline, and natural gas, etc.) and man-made fuels, which is not limited in the disclosure.

In implementations of the disclosure, the power-supply device 100 may include a storage battery and a generator. The battery and the generator cooperate to supply power, to supply a power signal to the load 300.

The load 300 is configured to receive the power signal outputted by the power-supply device, to drive internal components to operate according to the power signal.

In implementations of the disclosure, the load 300 is a device that can operate under action of an electric signal. The load 300 may be an electric ignition device, a drive motor, or other electric drive devices, which is not limited in the disclosure.

The switch circuit 200 is electrically coupled between the power-supply device 100 and the load 300. The switch circuit 200 is configured to transmit a power signal outputted by the power-supply device 100 to the load 300 when the switch circuit 200 is in a turned-on state. The switch circuit 200 is further configured to stop transmitting the power signal to the load 300 when the switch circuit 200 is in a turned-off state.

In implementations of the disclosure, the electric device 10 supplies, with the power-supply device 100, a power signal to the load 300, and the load 300 drives internal electronic components thereof to operate according to the power signal. Moreover, the switch circuit 200 coupled between the power-supply device 100 and the load 300 can control transmission of the power signal outputted by the power-supply device 100, to supply power to or power off the load 300.

Figure 2:
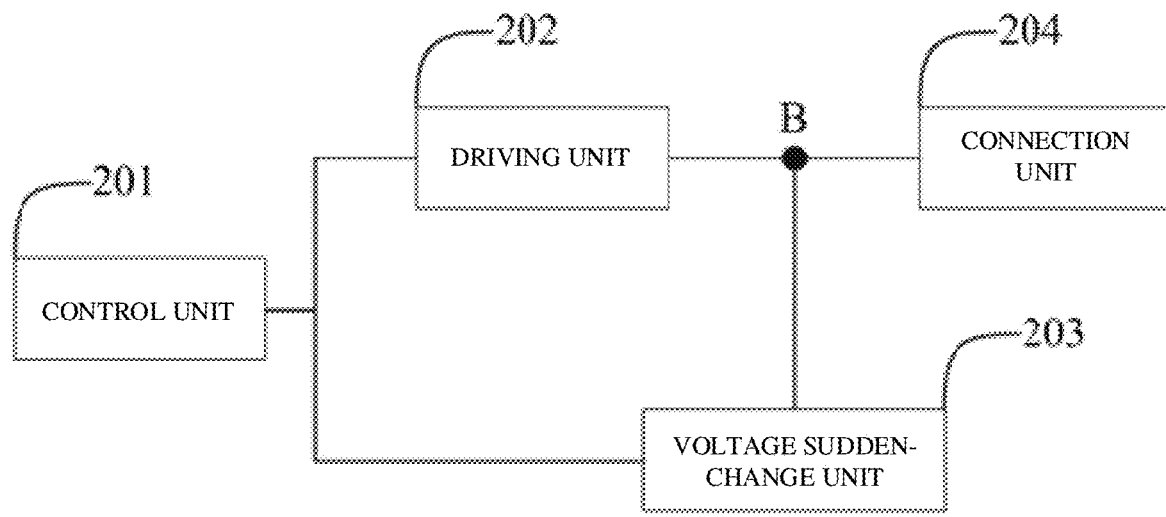
FIG. 2 is a schematic structural diagram illustrating a switch circuit of the electric device illustrated in FIG. 1 according to implementations.

FIG. 2 is a schematic structural diagram illustrating a switch circuit of the electric device illustrated in FIG. 1. As illustrated in FIG. 2, the switch circuit 200 includes a control unit 201, a driving unit 202, a voltage sudden-change unit 203, and a connection unit 204. The connection unit 204 is electrically coupled between the power-supply device 100 and the load 300, and is configured to turn on or turn off an electrical connection between the power-supply device 100 and the load 300.

The control unit 201 is electrically coupled with the driving unit 202, and the driving unit 202 is further electrically coupled with the connection unit 204. The control unit 201 is configured to output an enable signal to the driving unit 202 to control the driving unit 202 to output or stop outputting a driving signal to the connection unit 204, where the driving signal allows to turn on the connection unit 204. The connection unit 204 is in a turned-on state when the driving signal is received, and the connection unit 204 is in a turned-off state when no driving signal is received.

A driving node B is formed between the driving unit 202 and the connection unit 204. The voltage sudden-change unit 203 is electrically coupled with the driving node B.

The control unit 201 is further electrically coupled with the voltage sudden-change unit 203. The control unit 201 is further configured to output the enable signal to the voltage sudden-change unit 203, to control the voltage sudden-change unit 203 to generate and output a voltage sudden-change signal to the driving node B. The voltage sudden-change signal allows to control a potential at the driving node B to experience sudden change when the driving unit 202 stops outputting the driving signal, to make the connection unit 204 be switched to the turned-off state from the turned-on state quickly when no driving signal is received.

In the related art, the connection unit 204 is in a turned-on state when a driving signal is received, and the connection unit 204 is in a turned-off state when no driving signal is received. However, power MOS transistors of the connection unit 204 generally have a parasitic capacitance. In the case that no driving signal is received by the power MOS transistors, the power MOS transistors remain in the turned-on state due to residual charges in the parasitic capacitance, and the residual charges are discharged until the power MOS transistors cannot be turned on. As a result, when the driving unit 202 stops outputting the driving signal, the power MOS transistors work in a linear region due to slow discharge of the parasitic capacitance, which increases the risk of burning out the power MOS transistors and causes the connection unit 204 to be unable to switch to the turned-off state, thereby reducing safety and reliability of the switch circuit 200.

In the disclosure, the voltage sudden-change unit 203 of the switch circuit 200 can generate the voltage sudden-change signal to control the potential at the driving node B to experience sudden change when the driving unit 202 stops outputting the driving signal, which causes the parasitic capacitance of the power MOS transistors of the connection unit 204 to be discharged to zero quickly, so that the power MOS transistors are switched to the turned-off state quickly. In this way, it is possible to prevent the power MOS transistors from being burnt out due to working in the linear region, thereby improving reliability of the switch circuit 200 during operation.

In implementations of the disclosure, the control unit 201 may be a microcontroller unit (MCU), a field programmable gate array (FPGA), or other integrated circuits capable of controlling subsequent units, which is not limited in the disclosure.

In implementations of the disclosure, the enable signal outputted by the control unit 201 includes a first voltage signal and a second voltage signal. The first voltage signal allows to control the driving unit 202 to output a driving signal, to make the connection unit 204 enter the turned-on state. In this case, the switch circuit 200 is in the turned-on state, and the power-supply device 100 can be electrically coupled with the load 300 via the switch circuit 200.

The second voltage signal allows to control the driving unit 202 to stop outputting the driving signal to make the connection unit 204 enter the turned-off state, and further allows to control the voltage sudden-change unit 203 to generate and output a voltage sudden-change signal to control a potential at the driving node B to experience sudden change when the driving unit 202 stops outputting the driving signal, so that the connection unit 204 is switched to the turned-off state from the turned-on state quickly. In this case, the switch circuit 200 is in the turned-off state, and so the power-supply device 100 is not allowed to be electrically coupled with load 300 via the switch circuit.

Before the driving unit 202 stops outputting the driving signal, the potential at the driving node B is at high level due to the driving signal. In implementations of the disclosure, controlling the potential at the driving node B to experience sudden change herein refers to that the voltage sudden-change unit 203 pulls the potential at the driving node B down quickly when the driving unit 202 stops outputting the driving signal, that is, the potential at the driving node B is switched to a low level from a high level suddenly. In this way, a parasitic capacitance of power MOS transistors of the connection unit 204 is discharged to zero quickly, to make the power MOS transistors be switched to the turned-off state quickly. As such, the connection unit 204 can enter the turned-off state quickly.

Figure 3:
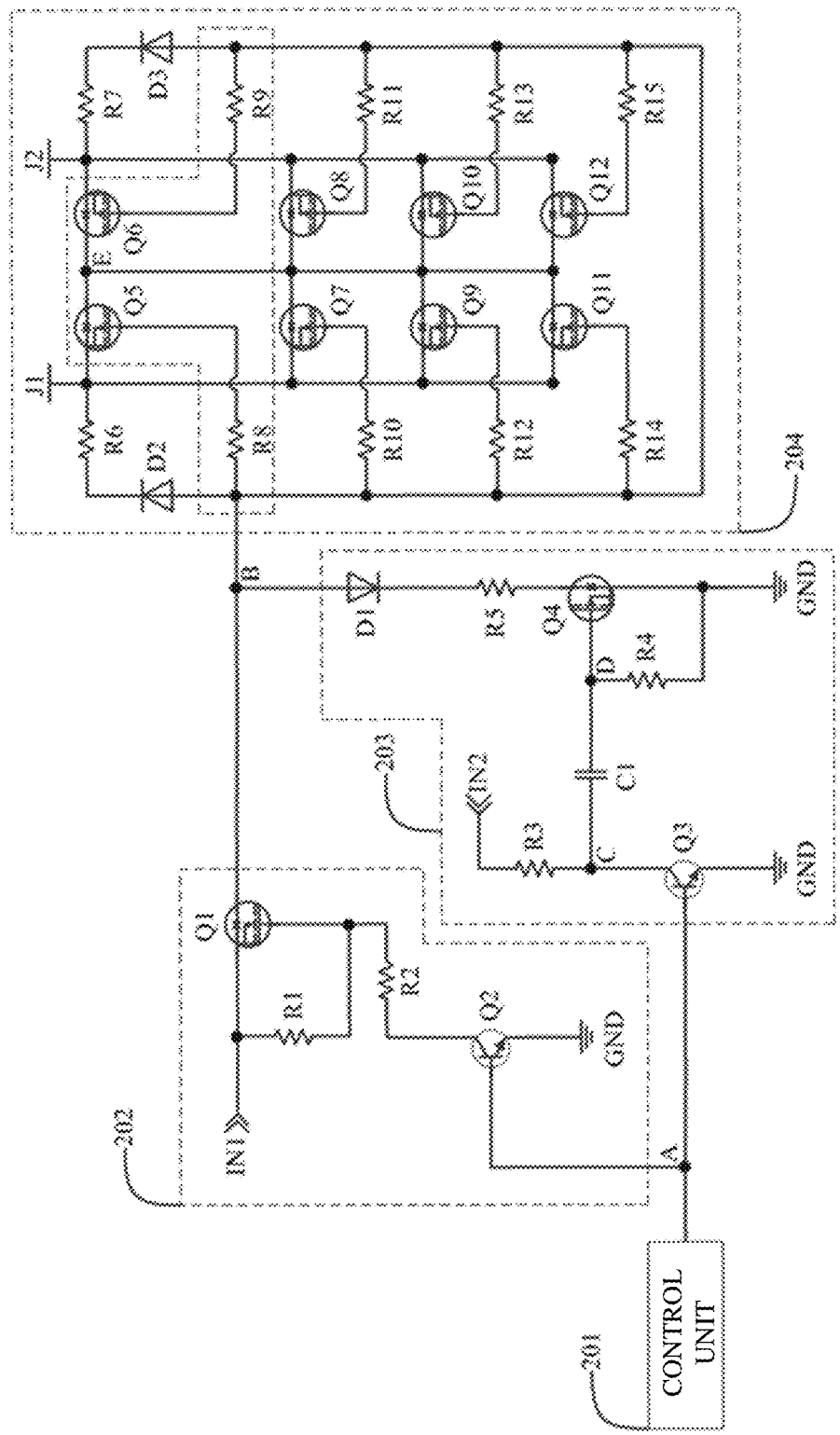
FIG. 3 is a schematic structural diagram illustrating a detailed circuit of the switch circuit illustrated in FIG. 2 according to implementations.

FIG. 3 is a schematic structural diagram illustrating a detailed circuit of the switch circuit illustrated in FIG. 2 according to implementations. As illustrated in FIG. 3, the control unit 201 is electrically coupled with a control node A. The control unit 201 is configured to output an enable signal to the control node A, and the control node A is configured to transmit the enable signal to the driving unit 202 and the voltage sudden-change unit 203.

In one implementation, the driving unit 202 includes a first input terminal IN1, a first transistor Q1, and a second transistor Q2. The first transistor Q1 for example is a P-type MOS transistor, and the second transistor Q2 for example is an NPN transistor. The first input terminal IN1 is configured to receive the driving signal inputted. A source of the first transistor Q1 is electrically coupled with the first input terminal IN1. A drain of the first transistor Q1 is electrically coupled with the driving node B. A gate of the first transistor Q1 is electrically coupled with the source of the first transistor Q1 via a first resistor R1, and is electrically coupled with a collector of the second transistor Q2 via a second resistor R2. An emitter of the second transistor Q2 is electrically coupled with a ground terminal GND. A base of the second transistor Q2 is electrically coupled with the control node A.

In implementations of the disclosure, the second transistor Q2 of the driving unit 202 is configured to receive the enable signal transmitted by the control node A to make the second transistor Q2 be turned on or turned off. Specifically, in the case that the enable signal at the control node A is at high level, the second transistor Q2 is turned on under action of the enable signal. In this case, the gate of the first transistor Q1 is electrically coupled with the ground terminal GND via the second resistor R2 and the turned-on second transistor Q2, to make a potential at the gate of the first transistor Q1 be pulled down. As a result, the first transistor Q1 is turned on, and so the driving signal received via the first input terminal IN1 can be transmitted to the driving node B, to make the connection unit 204 be in the turned-on state. In the case that the enable signal at the control node A is at low level, the second transistor Q2 is turned off under action of the enable signal. In this case, the gate of the first transistor Q1 is coupled with the first input terminal IN1 via the first resistor R1, to make the potential at the gate of the first transistor Q1 be pulled up. As a result, the first transistor Q1 is turned off, and so the driving signal cannot continue to be transmitted to the driving node B via the second transistor Q2, to make the connection unit 204 be in the turned-off state.

In one implementation, the voltage sudden-change unit 203 includes a second input terminal IN2, a third transistor Q3, a first capacitor C1, a first Zener diode D1, and a fourth transistor Q4. The third transistor Q3 for example is an NPN transistor, and the fourth transistor Q4 for example is an N-type MOS transistor. The second input terminal IN2 is electrically coupled with a collector of the third transistor Q3 and a first capacitor node C of the first capacitor C1 via a third resistor R3. The second input terminal IN2 is configured to receive a charging voltage inputted. A second capacitor node D of the first capacitor C1 is electrically coupled with a ground terminal GND via a fourth resistor R4. A base of the third transistor Q3 is electrically coupled with the control node A. An emitter of the third transistor Q3 is electrically coupled with the ground terminal GND. A collector of the third transistor Q3 is electrically coupled with the first capacitor node C of the first capacitor C1. An anode of the first diode D1 is electrically coupled with the driving node B. A cathode of the first diode D1 is electrically coupled with a drain of the fourth transistor Q4 via a fifth resistor R5. A gate of the fourth transistor Q4 is electrically coupled with the second capacitor node D. A source of the fourth transistor Q4 is electrically coupled with the ground terminal GND. The gate of the fourth transistor Q4 is further electrically coupled with the source of the fourth transistor Q4 via the fourth resistor R4.

In implementations of the disclosure, the third transistor Q3 of the voltage sudden-change unit 203 is configured to receive the enable signal transmitted by the control node A, to make the third transistor Q3 be turned on or turned off. The fourth transistor Q4 is switched between the turned-on state and the turned-off state according to a potential at the second capacitor node D.

When in use, in an initial state, the control unit 201 outputs a low-level enable signal, the third transistor Q3 is turned off under action of the enable signal, to form a current loop including the second input terminal IN2, the third resistor R3, the first capacitor C1, and the four resistors R4, and the ground terminal GND, so that the first capacitor C1 is charged due to receiving a charging voltage of the second input terminal IN2. In this case, the first capacitor node C is coupled with the second input terminal IN2 via the third resistor R3, and a potential at the first capacitor node C is at high level due to a high-level signal inputted via the second input terminal IN2 and a maintained action of the first capacitor C1. The second capacitor node D is electrically coupled with the ground terminal GND via the fourth resistor R4, to make the second capacitor node D be at low level, and so the fourth transistor Q4 is turned off. After charging, a voltage difference across the first capacitor C1 is relatively high.

When operating, in the case that the control unit 201 outputs a high-level enable signal, as stated above, the driving signal inputted via the first input terminal IN1 can be transmitted to the driving node B, that is, the driving node B is at high level, and so the connection unit 204 is in the turned-on state. The third transistor Q3 is turned on under action of the enable signal. The first capacitor node C is electrically coupled with the ground terminal GND via the turned-on third transistor Q3, so that a potential at the first capacitor node C is switched to a low-level state from a high-level state suddenly. Since a voltage difference across the first capacitor C1 is relatively high, and the first capacitor C1 does not allow the voltage difference across the first capacitor C1 to experience sudden change due to capacitance characteristics, a potential at the second capacitor node D is switched to a high-level state from a low-level state, to keep the voltage difference across the first capacitor C1 unchanged, and so the fourth transistor Q4 is turned on. Since the first capacitor C1 is electrically coupled with the ground terminal GND via the fourth resistor R4, the first capacitor C1 is discharged gradually, so that the potential at the second capacitor node D decreases gradually. The first capacitor C1 is discharged until the potential at the second capacitor node D is lower than a turn-on voltage Vgs(th) of the fourth transistor Q4. As a result, the fourth transistor Q4 is turned off.

After discharging, the voltage difference across the first capacitor C1 is relatively low.

When the fourth transistor Q4 is in the turned-on state or the turned-off state, the connection unit 204 remains in the turned-on state due to the driving node B receiving the driving voltage.

When the control unit 201 outputs a low-level enable signal, as stated above, the driving signal inputted via the first input terminal IN1 is not allowed to be transmitted to the driving node B. The third transistor Q3 is turned off under action of the enable signal. As a result, the first capacitor node C is disconnected from the ground terminal GND, and the first capacitor node C is electrically coupled with the second input terminal IN2 via the third resistor R3, so that a potential at the first capacitor node C is switched to a high-level state from a low-level state suddenly. Since the voltage difference across the first capacitor C1 is relatively low, and the first capacitor C1 does not allow the voltage difference across the first capacitor C1 to experience sudden change due to capacitance characteristic, a potential at the second capacitor node D is switched to a high-level state from a low-level state, to keep the voltage difference across the first capacitor C1 unchanged, and so the fourth transistor Q4 is turned on. Accordingly, residual charges in a parasitic capacitance of MOS transistors of the connection unit 204 are discharged quickly through a loop including the driving node B, the first diode D1, the fifth resistor R5, the fourth transistor Q4, and the ground terminal GND, so that the residual charges of the MOS transistors of the connection unit 204 are discharged to zero quickly. In this way, the MOS transistors of the connection unit 204 can be turned off quickly, and so the connection unit 204 is switched to the turned-off state from the turned-on state quickly.

Since the first capacitor C1 is electrically coupled with the ground terminal GND via the fourth resistor R4, the first capacitor C1 is discharged gradually, so that the potential at the second capacitor node D decreases gradually. The first capacitor C1 is discharged until the potential at the second capacitor node D is lower than a turn-on voltage Vgs(th) of the fourth transistor Q4. As a result, the fourth transistor Q4 is turned off. After the fourth transistor Q4 is turned off, the connection unit 204 remains in the turned-off state since no driving voltage is received at the driving node B.

In one implementation, the connection unit 204 includes a first connection terminal J1, a second connection terminal J2, a second diode D2, a third diode D3, and multiple connection subunits. An anode of the second diode D2 is electrically coupled with the driving node B. A cathode of the second diode D2 is electrically coupled with the first connection terminal J1 via a sixth resistor R6. The first connection terminal J1 is configured to be coupled with one of the power-supply device 100 and the load 300. An anode of the third diode D3 is electrically coupled with the driving node B. A cathode of the third diode D3 is electrically coupled with the second connection terminal J2 via a seventh resistor R7. The second connection terminal J2 is configured to be coupled with another device between the power-supply device 100 and the load 300.

The multiple connection subunits are similar in structure. Hereinafter, the structure of each connection subunit is described in detail, in which one of the connection subunits of the disclosure is taken as an example.

The connection subunit includes a fifth transistor Q5 and a sixth transistor Q6. Both the fifth transistor Q5 and the sixth transistor Q6 are N-type transistors. A gate of the fifth transistor Q5 is electrically coupled with the driving node B via an eighth resistor R8. A source of the fifth transistor Q5 is electrically coupled with the first connection terminal J1. A drain of the fifth transistor Q5 is electrically coupled with a transmission node E. The transmission node E is configured to transmit an electrical signal between the first connection terminal J1 and the second connection terminal J2. A gate of the sixth transistor Q6 is electrically coupled with the driving node B via a ninth resistor R9. A source of the sixth transistor Q6 is electrically coupled with the second connection terminal J2. A drain of the sixth transistor Q6 is electrically coupled with the transmission node E.

In implementations of the disclosure, the connection unit 204 includes four connection subunits. The four connection subunits operate in parallel, that is, if one of the four connection subunits is damaged, the other connection subunits can still operate. Moreover, the four connection subunits operating in parallel can improve a current transmission capability of the connection unit 204. The number of the connection subunits of the connection unit 204 may be increased or decreased according to actual needs, which is not limited in the disclosure.

In implementations of the disclosure, MOS transistors of the connection unit 204 are switched between the turned-on state and the turned-off state according to a potential signal at the driving node B. Specifically, in an initial state, the control unit 201 outputs a low-level enable signal, and the first transistor Q1 is turned off under action of the enable signal. As a result, a driving signal inputted via the first input terminal IN1 cannot be outputted to the MOS transistors of the connection unit 204 via the first transistor Q1, and so the MOS transistors of the connection unit 204 are in the turned-off state. When operating, the control unit 201 outputs a high-level enable signal, and so the driving signal inputted via the first input terminal IN1 can be transmitted to the driving node B, to make the driving node B be at high level. As a result, the MOS transistors of the connection unit 204 are in the turned-on state. Accordingly, an electrical connection between the power-supply device 100 electrically coupled with the first connection terminal J1 and the load 300 electrically coupled with the second connection terminal J2 is turned on. When the operating is finished, the control unit outputs a low-level enable signal, and so the driving signal inputted via the first input terminal IN1 cannot be transmitted to the driving node B. Residual charges in a parasitic capacitance of the MOS transistors of the connection unit 204 are discharged to zero by means of the voltage sudden-change unit 203 electrically coupled with the driving node B. In this way, the MOS transistors of the connection unit 204 are turned off quickly, and so the connection unit 204 is switched to the turned-off state from the turned-on state quickly. Accordingly, the electrical connection between the power-supply device 100 and the load 300 is turned off.

Compared to the related art, the voltage sudden-change unit 203 of the switch circuit 200 of the implementations of the disclosure can generate a voltage sudden-change signal to control a potential at the driving node B to experience sudden change when the driving unit 202 stops outputting a driving signal used for turning on the connection unit 204, which causes a parasitic capacitance of power MOS transistors of the connection unit 204 to be discharged to zero quickly, so that the power MOS transistors are switched to the turned-off state quickly. In this way, a situation where the power MOS transistor is burnt out due to working in a linear region can be avoided, thereby improving reliability of the switch circuit 200 during operation.

The switch circuit and the electric device of the implementations of the disclosure have been described in detail above. While the principles and implementations of the disclosure have been described in connection with illustrative implementations, it is to be understood that foregoing implementations are only used to help understand the method and core idea of the disclosure. As will occur to those skilled in the art, the disclosure is susceptible to various modifications and changes without departing from the spirit and principle of the disclosure. Therefore, the disclosure is not limited to the disclosed implementations.

What is claimed is:

1. A switch circuit, comprising a control unit, a driving unit, a voltage sudden-change unit, and a connection unit, wherein
   the connection unit is electrically coupled between a power-supply device and a load, and is configured to turn on or turn off an electrical connection between the power-supply device and the load;
   the control unit is electrically coupled with the driving unit, the driving unit is further electrically coupled with the connection unit, and the control unit is configured to output an enable signal to the driving unit to control the driving unit to output or stop outputting a driving signal to the connection unit, wherein the driving signal allows to turn on the connection unit; and
   the voltage sudden-change unit is electrically coupled with a driving node between the driving unit and the connection unit, the control unit is further electrically coupled with the voltage sudden-change unit, and the control unit is further configured to output the enable signal to the voltage sudden-change unit to control the voltage sudden-change unit to generate and output a voltage sudden-change signal to the driving node, wherein the voltage sudden-change signal allows to control a potential at the driving node to experience sudden change when the driving unit stops outputting the driving signal, to make the connection unit be switched to a turned-off state from a turned-on state quickly when no driving signal is received.

2. The switch circuit of claim 1, wherein the enable signal comprises:
   a first voltage signal, allows to control the driving unit to output the driving signal to the connection unit, to make the connection unit be switched to the turned-on state; and
   a second voltage signal, allows to control the driving unit to stop outputting the driving signal and control the voltage sudden-change unit to output the voltage sudden-change signal, to make the potential at the driving node experience sudden change and make the connection unit be switched to the turned-off state.

3. The switch circuit of claim 1, wherein the driving unit comprises a first input terminal, a first transistor, and a second transistor, wherein
   a gate of the first transistor is electrically coupled with a source of the first transistor via a first resistor;
   the gate of the first transistor is further electrically coupled with a collector of the second transistor via a second resistor, the source of the first transistor is further electrically coupled with the first input terminal, and a drain of the first transistor is electrically coupled with the driving node, wherein the first input terminal is configured to input the driving signal; and
   an emitter of the second transistor is electrically coupled with a ground terminal, and a base of the second transistor is electrically coupled with a control node, wherein the control node is electrically coupled with the control unit and configured to receive the enable signal outputted by the control unit.

4. The switch circuit of claim 1, wherein the voltage sudden-change unit comprises a second input terminal, a third transistor, and a first capacitor, wherein
   the second input terminal is electrically coupled with a first capacitor node via a third resistor, wherein the first capacitor node is configured to receive a charging voltage inputted via the second input terminal;
   a base of the third transistor is electrically coupled with the control node, an emitter of the third transistor is electrically coupled with a ground terminal, and a collector of the third transistor is electrically coupled with the first capacitor node; and
   the first capacitor is electrically coupled between the first capacitor node and a second capacitor node, and a potential signal at the second capacitor node is used as a pull-down control signal.

5. The switch circuit of claim 4, wherein the voltage sudden-change unit further comprises a first diode and a fourth transistor, wherein
   a gate of the fourth transistor is electrically coupled with a source of the fourth transistor via a fourth resistor;
   an anode of the first diode is electrically coupled with the driving node, and a cathode of the first diode is electrically coupled with a drain of the fourth transistor via a fifth resistor; and
   the gate of the fourth transistor is electrically coupled with the second capacitor node, and the source of the fourth transistor is electrically coupled with the ground terminal.

6. The switch circuit of claim 1, wherein the connection unit comprises a first connection terminal, a second connection terminal, a second diode, a third diode, and at least one connection subunit, wherein
   an anode of the second diode is electrically coupled with the driving node, and a cathode of the second diode is electrically coupled with the first connection terminal via a sixth resistor, wherein the first connection terminal is configured to be electrically coupled with the power-supply device, and the power-supply device is configured to output a power signal;
   an anode of the third diode is electrically coupled with the driving node, a cathode of the third diode is electrically coupled with the second connection terminal via a seventh resistor, wherein the second connection terminal is configured to be electrically coupled with the load, and the load is configured to receive the power signal to operate; and the at least one connection subunit is electrically coupled between the first connection terminal and the second connection terminal.

7. The switch circuit of claim 6, wherein the at least one connection subunit is switched between the turned-on state and the turned-off state according to a potential signal at the driving node.

8. The switch circuit of claim 5, wherein the enable signal outputted by the control unit is a first voltage signal, wherein
the driving signal is transmitted to the driving node to make the connection unit be in the turned-on state;
the third transistor is turned on under action of the first voltage signal, the first capacitor node is electrically coupled with the ground terminal via the third transistor turned-on, a potential at the second capacitor node experiences sudden change to make the fourth transistor be turned on; and
the second capacitor node discharges to the ground terminal via the fourth resistor until the potential at the second capacitor node is lower than a turn-on voltage of the fourth transistor, and the fourth transistor is turned off.

9. The switch circuit of claim 5, wherein the enable signal outputted by the control unit is a second voltage signal, wherein
the driving signal is not allowed to be transmitted to the driving node;
the third transistor is turned off under action of the second voltage signal, the first capacitor node is disconnected from the ground terminal, a potential at the second capacitor node experiences sudden change to make the fourth transistor be turned on; and
residual charges in a parasitic capacitance of transistors of the connection unit are discharged to zero through a loop formed by the driving node, the first diode, the fifth resistor, the fourth transistor, and the ground terminal, and the transistors of the connection unit are turned off.

10. An electric device, comprising:
a power-supply device;
a load; and
a switch circuit comprising a control unit, a driving unit, a voltage sudden-change unit, and a connection unit, wherein
the connection unit is electrically coupled between the power-supply device and the load, and is configured to turn on or turn off an electrical connection between the power-supply device and the load;
the control unit is electrically coupled with the driving unit, the driving unit is further electrically coupled with the connection unit, and the control unit is configured to output an enable signal to the driving unit to control the driving unit to output or stop outputting a driving signal to the connection unit, wherein the driving signal allows to turn on the connection unit; and
the voltage sudden-change unit is electrically coupled with a driving node between the driving unit and the connection unit, the control unit is further electrically coupled with the voltage sudden-change unit, and the control unit is further configured to output the enable signal to the voltage sudden-change unit to control the voltage sudden-change unit to generate and output a voltage sudden-change signal to the driving node, wherein the voltage sudden-change signal allows to control a potential at the driving node to experience sudden change when the driving unit stops outputting the driving signal, to make the connection unit be switched to a turned-off state from a turned-on state quickly when no driving signal is received;
wherein the power-supply device is electrically coupled with the load via the switch circuit, and the power-supply device is configured to output the power signal to the load when the switch circuit is in the turned-on state; and
wherein the load is configured to receive the power signal when the switch circuit is in the turned-on state and operate according to the power signal.

11. The electric device of claim 10, wherein the enable signal comprises:
a first voltage signal, allows to control the driving unit to output the driving signal to the connection unit, to make the connection unit be switched to the turned-on state; and
a second voltage signal, allows to control the driving unit to stop outputting the driving signal and control the voltage sudden-change unit to output the voltage sudden-change signal, to make the potential at the driving node experience sudden change and make the connection unit be switched to the turned-off state.

12. The electric device of claim 10, wherein the driving unit comprises a first input terminal, a first transistor, and a second transistor, wherein
a gate of the first transistor is electrically coupled with a source of the first transistor via a first resistor;
the gate of the first transistor is further electrically coupled with a collector of the second transistor via a second resistor, the source of the first transistor is further electrically coupled with the first input terminal, and a drain of the first transistor is electrically coupled with the driving node, wherein the first input terminal is configured to input the driving signal; and
an emitter of the second transistor is electrically coupled with a ground terminal, and a base of the second transistor is electrically coupled with a control node, wherein the control node is electrically coupled with the control unit and configured to receive the enable signal outputted by the control unit.

13. The electric device of claim 10, wherein the voltage sudden-change unit comprises a second input terminal, a third transistor, and a first capacitor, wherein
the second input terminal is electrically coupled with a first capacitor node via a third resistor, wherein the first capacitor node is configured to receive a charging voltage inputted via the second input terminal;
a base of the third transistor is electrically coupled with the control node, an emitter of the third transistor is electrically coupled with a ground terminal, and a collector of the third transistor is electrically coupled with the first capacitor node; and
the first capacitor is electrically coupled between the first capacitor node and a second capacitor node, and a potential signal at the second capacitor node is used as a pull-down control signal.

14. The electric device of claim 13, wherein the voltage sudden-change unit further comprises a first diode and a fourth transistor, wherein
a gate of the fourth transistor is electrically coupled with a source of the fourth transistor via a fourth resistor;
an anode of the first diode is electrically coupled with the driving node, and a cathode of the first diode is electrically coupled with a drain of the fourth transistor via a fifth resistor; and the gate of the fourth transistor is electrically coupled with the second capacitor node, and the source of the fourth transistor is electrically coupled with the ground terminal.

15. The electric device of claim 10, wherein the connection unit comprises a first connection terminal, a second connection terminal, a second diode, a third diode, and at least one connection subunit, wherein
   an anode of the second diode is electrically coupled with the driving node, and a cathode of the second diode is electrically coupled with the first connection terminal via a sixth resistor, wherein the first connection terminal is configured to be electrically coupled with the power-supply device, and the power-supply device is configured to output a power signal;
   an anode of the third diode is electrically coupled with the driving node, a cathode of the third diode is electrically coupled with the second connection terminal via a seventh resistor, wherein the second connection terminal is configured to be electrically coupled with the load, and the load is configured to receive the power signal to operate; and
   the at least one connection subunit is electrically coupled between the first connection terminal and the second connection terminal.

16. The electric device of claim 15, wherein the at least one connection subunit is switched between the turned-on state and the turned-off state according to a potential signal at the driving node.

17. The electric device of claim 14, wherein the enable signal outputted by the control unit is a first voltage signal, wherein
   the driving signal is transmitted to the driving node to make the connection unit be in the turned-on state;
   the third transistor is turned on under action of the first voltage signal, the first capacitor node is electrically coupled with the ground terminal via the third transistor turned-on, a potential at the second capacitor node experiences sudden change to make the fourth transistor be turned on; and
   the second capacitor node discharges to the ground terminal via the fourth resistor until the potential at the second capacitor node is lower than a turn-on voltage of the fourth transistor, and the fourth transistor is turned off.

18. The electric device of claim 14, wherein the enable signal outputted by the control unit is a second voltage signal, wherein
   the driving signal is not allowed to be transmitted to the driving node;
   the third transistor is turned off under action of the second voltage signal, the first capacitor node is disconnected from the ground terminal, a potential at the second capacitor node experiences sudden change to make the fourth transistor be turned on; and
   residual charges in a parasitic capacitance of transistors of the connection unit are discharged to zero through a loop formed by the driving node, the first diode, the fifth resistor, the fourth transistor, and the ground terminal, and the transistors of the connection unit are turned off.

* * * * *